March 5, 1968 M. KANTOR 3,372,310

UNIVERSAL MODULAR PACKAGES FOR INTEGRATED CIRCUITS

Filed April 30, 1965 3 Sheets-Sheet 1

INVENTOR
MISHA I. KANTOR

BY Hurvitz & Rose

ATTORNEYS

March 5, 1968 M. KANTOR 3,372,310

UNIVERSAL MODULAR PACKAGES FOR INTEGRATED CIRCUITS

Filed April 30, 1965

3 Sheets-Sheet 2

INVENTOR
MISHA I. KANTOR

BY Hurvitz & Rose
ATTORNEYS

UNIVERSAL MODULAR PACKAGES FOR INTEGRATED CIRCUITS

Filed April 30, 1965

3 Sheets-Sheet 3

INVENTOR
MISHA I. KANTOR

BY Hurvitz & Rose
ATTORNEY

United States Patent Office 3,372,310
Patented Mar. 5, 1968

3,372,310
UNIVERSAL MODULAR PACKAGES FOR INTEGRATED CIRCUITS

Misha Kantor, Orlando, Fla., assignor to Radiation Incorporated, Melbourne, Fla., a corporation of Florida Filed Apr. 30, 1965, Ser. No. 452,184
5 Claims. (Cl. 317—101)

The present invention relates generally to the field of microelectronics, that is, to the production of microminiaturized electronic structures, and more particularly to modular packages of integrated circuits arranged in planar or multiplanar array to form electronic subsystems or systems, and to processes for manufacturing the integrated circuit modules.

Among the several objects of the present invention, the following are of primary importance:

(1) To provide planar modules of integrated physical and electrical structure in environmentally stable packages;

(2) To provide maximum density packaging of microelectronic components with a high degree of reliability in overall circuit operation;

(3) To reduce the cost of manufacture of integrated circuits by electrically interconnecting uncased monolithic chips, that is, microelectronic and thin film integrated devices, via an intraconnected matrix of conductors applied to the support substrate of a universal module to which the chips are integrally bonded;

(4) To provide processes for production of planar modules which will reduce loss of material or scrap factor to minimum levels;

(5) To provide planar modules which are protected against internal damage from shock and vibration;

(6) To provide improved methods and means of connecting the circuit chips to the conductive matrix of the module;

(7) To reduce the stresses on connections and interconnections within the integrated circuit module by elimination of any necessity of physical support or restraint of the chips by the connections;

(8) To provide abrasion-resistant and radiation-resistant microelectronic packages;

(9) To provide modular packages of plug-in construction wherein the connector pins of each package are integral with the matrix of conductors traversing the module substrate;

(10) To provide a matrix of conductors within the base substrate wherein the conductors are interconnected via a pattern of conductor-carrying through holes.

The problems which have been heretofore encountered in the production of microelectronic circuit structure are many. Two of the more serious are, first, that techniques adapted to the fabrication of conventionally-sized (according to former standards) component packages are unsuitable for the production of microelectronic packages. Basically, this problem arises from the vast differences in the suitability of connections between circuit components and conductive leads, and in the manner and facility of component mounting in the two types of packages. Secondly, prior art microelectronic structures have been plagued by far lower circuit reliability than that which has been achieved using conventionally-size electronic packages. The source of this problem lies in both electrical and physical difficulties stemming to a great extent from the vast reduction in size of the former over the latter, although other considerations, such as appropriateness of materials, are also involved. The present invention is intended to solve these and other significant problems in the field of microelectronics.

Briefly, in accordance with the present invention, a planar integrated circuit module comprises a plurality of microelectronic circuit chips, a substrate for supporting the chips integrally therewith in a predetermined array and having physical and electrical properties substantially identical to those of the chip substrate, an intraconnected matrix of conductors lacing the substrate, selected ones of the leads or lands of the chip microcircuits being connected to selected ones of the conductors in the matrix, a plurality of connector pins partially molded in the body of the substrate and projecting from a surface thereof, the pins being integral with selected conductors of the matrix respectively, a spacer layer of substrate material over the support or base and chips, a pair of insulatively coated metal cover plates between which the substrate, chips and spacer are interposed, means providing a hermetic seal of the entire arrangement of component parts, and a protective shock and vibration resistant band or frame wrapped about the ends of the assembly to prevent internal damage to the module.

Also, briefly stated, a process for producing planar modules of the above described type in accordance with the present invention comprises the steps of molding the substrate with a predetermined array of connector pins extending partially internally thereof, and with a pattern of spaced grooves along surfaces of the substrate in accordance with the desired matrix pattern of conductors to be deposited therein, providing a plurality of holes through the substrate to connect various grooves at crossover points on opposite surfaces, depositing conductive material in the grooves and holes to provide the desired conductor matrix, surface grinding both sides of the substrate to remove undesired conductive material from areas between the grooves, dipping and glazing the substrate to protect the conductors, positioning the microelectronic circuit chips in place at surface regions of the substrate between conductors and thermally bonding the chips in an integral relationship with the substrate, removing conductive material from the grooves at predetermined points of the matrix to provide the desired circuit terminations after the chips are interconnected via the matrix, placing a spacer layer of substrate material over the circuit chips and applying cover plates to the exterior surfaces of substrate and spacer layer, hermetically sealing the assembly, and wrapping a resilient band of metallic material about the edges of the assembly to provide shock and vibration resistance.

In addition to the objectives and advantages of the planar module and the fabrication process previously mentioned, the structure of the modules is so developed as to be particularly adaptable to fabrication by computerized circuit design and analysis techniques as well as by other forms of automated assembly so that mass production of the modules is readily effected.

Moreover, large quantities of universal or standardized modules may be produced preparatory to the manufacture of final integrated circuit packages therefrom, and independently of any knowledge of final circuit requirements. This feature of adaptability to virtually any circuit design requirement is provided by the integrated construction of support substrate, intraconnected conductive matrix, and external circuit connecting points integral with the matrix. Variations in final packaged circuitry will depend solely upon number and type of microelectronic circuit chips selected, upon the interconnection of the chips via the matrix, and upon the points of the matrix selected for severance to establish the desired circuit terminations.

While this universality or unrestricted versatility of the basic module is extremely desirable and offers distinct production advantages, it is to some extent collateral to other objects of the present invention. The invention contemplates a physical realization of multiple microcircuit elements which are inseparably associated both physically and electrically within a unitary or continuous body to perform the functions of a complete electronic system or a part thereof. Operational reliability of such units is extremely high because of structural continuity in every aspect; yet each unit may readily be replaced, in accordance with changing system requirements or in the unlikely event of unpredicted failure, by virtue of the plug-in construcion. In this connection, it will be noted that system reliability may be evaluated from a knowledge of failure rates of the components and interconnections, although a determination of failure rate is meaningful only when accompanied by a knowledge of environmental conditions. When similar conditions exist, comparison of failure rates is valid; otherwise, extrapolation is required from available data. It will readily be appreciated that an inventory of on-hand units is maintained in accordance with predictable probability of system survival, and that, in conjunction therewith, it is most desirable to provide system components capable of rapid replacement to prevent lengthy down-times as well as to facilitate versatility of modification as a function of varying system requirements.

The above and still further objects, feautres and attendant advantages of the present invention will become apparent upon a consideration of the following detailed description of specific embodiments thereof and specific processes of production, especially when taken in conjunction with the accompanying drawings in which.

Figures 1, 2, 3:
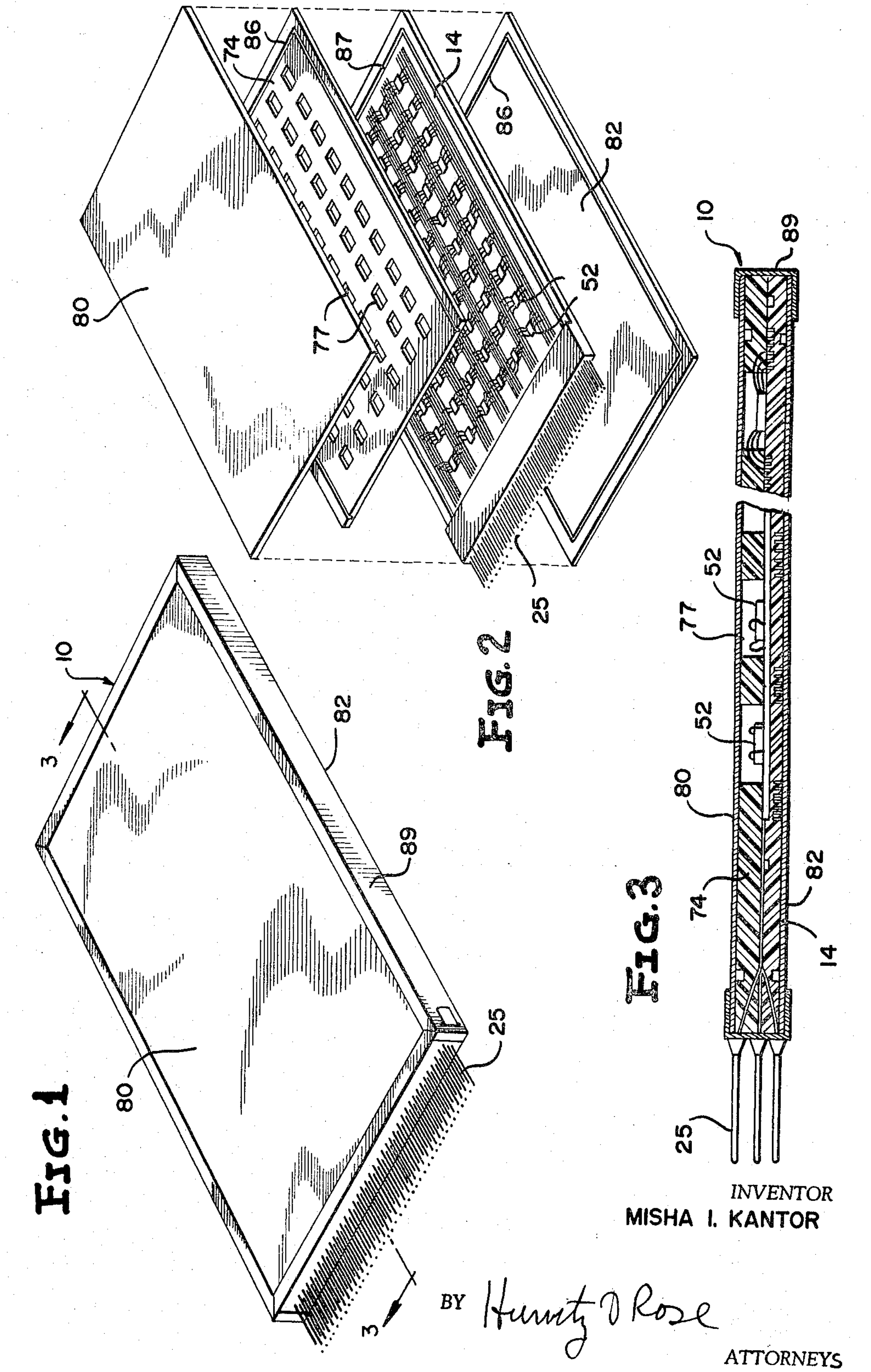
FIGURE 1 is a perspective view of an exemplary form of the completed planar module.
FIGURE 2 is an exploded view in perspective, showing some of the basic parts of the completed assembly.
FIGURE 3 is a sectional view of the completed planar module taken through the lines 3—3 of FIGURE 1.

Referring now to the drawing wherein like reference numerals are used to refer to like parts in the several figures, the supporting substrate for the microelectronic circuit chips is selected from a material possessing physical and electrical properties corresponding closely to those of the chips, so that when the chips are bonded to the substrate, as will presently be described in detail, a truly integrated body of substrate and multiple circuit elements will be formed. Such an arrangement will eventually provide an electronic system or subsystem of inseparably associated components within a single continuous medium. It is desirable that the material of which the substrate is comprised be readily moldable, such as by transfer, injection, or compression molding or other conventional molding processes, into a grooved planar form. Moldable ceramics are presently available which nearly match the physical and electrical characteristics of the monolithic substrate layer on which the microcircuits are disposed in the form of thin films or other integrated device structure of which the chips are comprised.

A preferred material for the substrate is glass bonded mica compound, this material being especially compatible with system requirements. Moreover, the glass bonded mica, sold under the name "Mykroy," is particularly adaptable to conventional molding techniques and when hardened is readily machinable, as by grinding, drilling and so forth. The general and specific properties of several grades of Mykroy set forth in the table below illustrate its particular suitability for use as the supporting substrate in the planar module.

TABLE.—MYKROY PROPERTIES

| Properties | Units | Glass-Bonded Mica Grades | | |
|---|---|---|---|---|
| | | Mykroy 750 | Mykroy 1100 | Mykroy 1116 |
| General: | | | | |
| Specific Gravity | ---------- | 3.3 | 3.2 | 3.2 |
| Moisture Absorption | ---------- | Nil | Nil | Nil |
| Max. Continuous Temp | ° F | 750 | 1100 | 1100 |
| Coef. of Expansion | $\times 10^{-6}$, ° F | 5.6 | 5.2 | 5.2 |
| Electrical: | | | | |
| Vol. Resistivity | ohm-cm | $10^{13}$ | $10^{14}$ | $10^{14}$ |
| Dielectric ⅛″ | volts/mil | 350 | 400 | 400 |
| Dielectric Constant | 1 mc | 7.1 | 7.50 | 7.4 |
| Dissipation Factor | 1 mc | .0014 | .0012 | .0019 |
| Loss Factor | 1 mc | .0099 | .016 | .014 |
| Surface Resistivity | Dry ohm | $10^{16}$ | $10^{16}$ | $10^{16}$ |
| Surface Resistivity | Wet ohm | $10^{10}$ | $10^{11}$ | $10^{12}$ |
| Mechanical: | | | | |
| Tensile | p.s.i | 9,000 | 8,000 | 7,500 |
| Flexural | p.s.i | 21,600 | 13,900 | 11,000 |
| Compressive | p.s.i | 36,000 | 30,000 | 30,000 |
| Modulus of Elasticity | p.s.i | $10\times10^6$ | $7\times10^6$ | $7\times10^6$ |
| Impact Strength (Izod) | in.-lbs | 1.7 | 1.3 | 1.2 |

In addition, Mykroy is an excellent insulator at high frequencies; it is capable of being molded with metal inserts or leads to extremely close tolerances; it is, like ceramic, dimensionally stable with changes of temperature, time and environment, but, unlike ceramic, it has a coefficient of thermal expansion close to that of most metals; it is readily machinable; it may be surface ground to optical flatness, so that polishing to a three microinch finish is attainable; it is adaptable to conventional molding techniques so that it provides a means for production standardization and for the construction of bodies of various shapes; and it is readily adaptable to any form of metalization, such as vacuum deposition and electroless plating as well as low-temperature fired-on metalizing.

Figure 8:
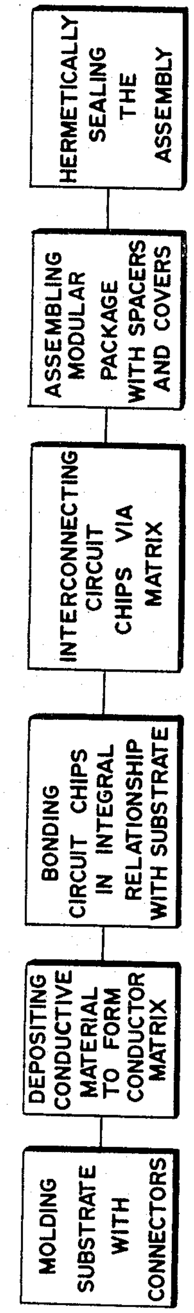
FIGURE 8 is a flow diagram illustrating the steps in an exemplary process for producing planar integrated circuit modules.

An exemplary process of producing the integrated circuit modules is best followed by reference to FIGURE 8 with concurrent reference to the various figures showing details of construction.

Figures 4, 5:
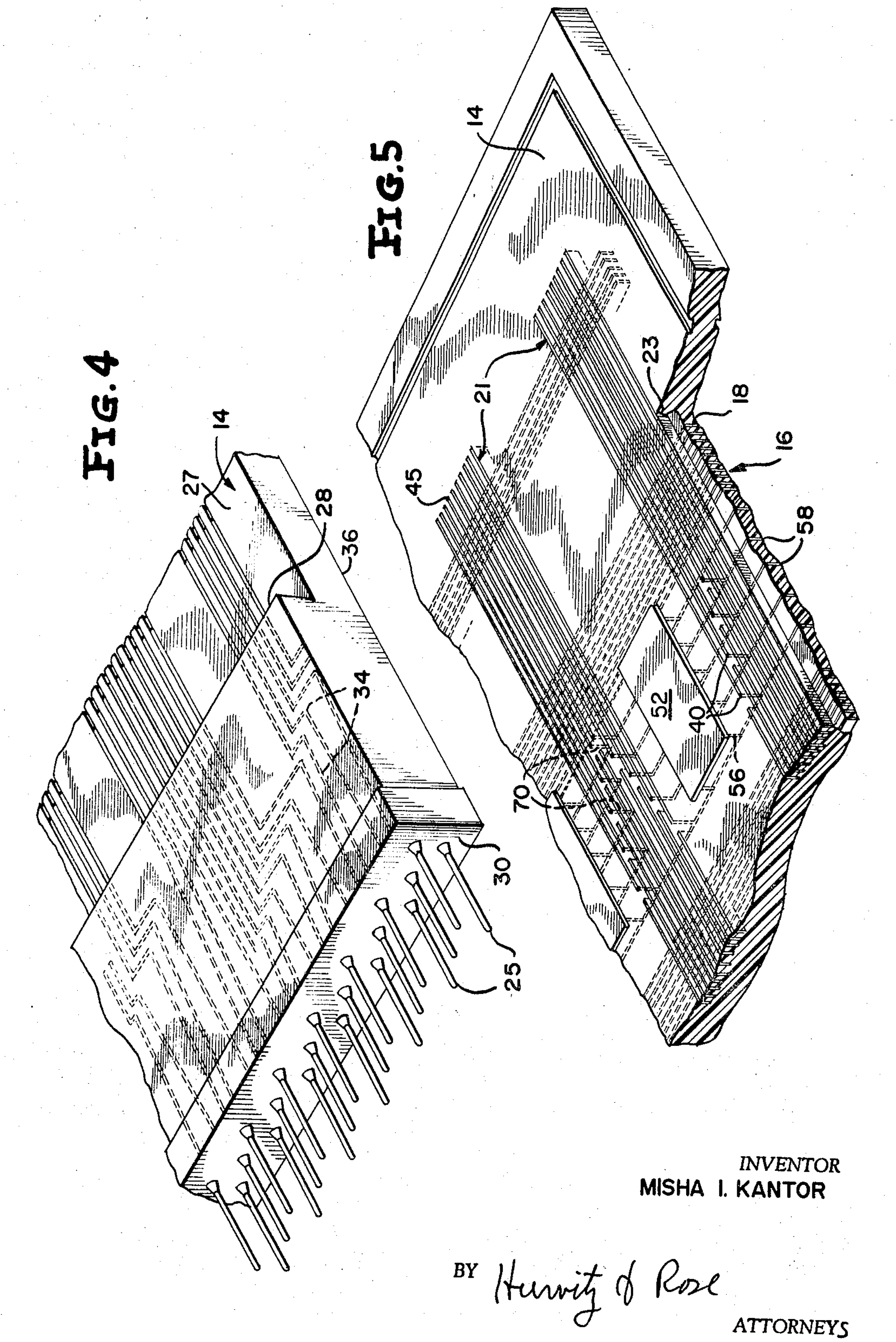
FIGURE 4 is a fragmentary perspective view of the substrate of the module showing the interconnection of connecting pins and portions of the conductor matrix.
FIGURE 5 is a fragmentary perspective view of a portion of the module showing one form of chip installation on the substrate and the electrical connection of the chip with the conductor matrix.

Initially the substrate material is molded, such as by compression, injection, or transfer molding, for example, to form an insulating sheet, slice, or slab 14 having a pair of opposed and spaced surfaces, with one of the surfaces containing a number of rows 16 of grooves 18 and the other surface a number of columns 21 of grooves 23 (see, e.g., FIGURE 5). That is, the rows and columns of grooves on opposite surfaces of the substrate run at substantially 90° to one another, but each surface contains only grooves running in parallel alignment. In a preferred arrangement, the grooves are placed in groups of several spaced grooves each so that the groups are separated by a distance sufficient to allow the positioning of microelectronic circuit chips therebetween. Groove width and depth dimensions of from .005 to .010 inch are readily attainable in the molding process of the glass bonded mica substrate.

It is contemplated that each planar integrated circuit 10 (FIGURES 1–3) will form an electronic system or subsystem which may be interconnected with various other modules to form the desired complete electronic assembly. The most advantageous arrangement, therefore, is that each module constitute a plug-in unit having male connecting pins arranged to mate with female connectors, for example, in a system connecting board or package. To this end, a plurality of connector pins or other electrical connectors or terminals 25, suitable for establishing external circuit connection points are incorporated within the body of the substrate during the molding process in accordance with the preestablished array of mating connectors into which the module is to be plugged. For this purpose, the substrate may include a stepped portion 28 (FIGURE 4) along one surface 27 thereof and adjacent the end or edge 30 into which the internal conductors of the connecting pins extend to the surface of the step. The external portions of pins 25 are arranged to project from the end surface of the substrate in a parallel array. Internally of the substrate, the pins may comprise extended strip conductors 34 which are arranged in any suitable manner to conform to the pattern of grooves on one or both of the substrate surfaces 27 and 36. It is desirable that the cross sectional area of each pin and internal extended strip portion conform closely to the cross sectional area of each conductor of the matrix which is to be formed on the main planar surfaces 27, 36 of the substrate.

Following the step of molding the base or support substrate a matrix of conductors is formed on the substrate surfaces within the preformed grooves described above. To provide means for matrix intraconnection a plurality of holes 40 (e.g., FIGURE 5) is provided through the substrate, as by drilling the hardened substrate slice or by forming the holes during molding. The holes are arranged in a pattern to connect grooves in rows on one surface to grooves in columns on the other surface at predetermined intersection or crossover points. The pattern of groove-connecting holes is sufficiently extensive to permit flexibility in final circuit connections as determined by the particular circuit requirements of each planar module. Versatility of the basic module is provided in that the conductor matrix and intraconnection thereof may be identical for each module with subsequent specific circuit designs accommodated simply by severing the matrix at desired points.

After the groove-connecting holes have been provided in the substrate slice, the matrix intraconnection pattern is defined in accordance with interconnection of column grooves on one surface of the substrate with row grooves on the other surface. Preferably, each through hole diameter is approximately equal to groove width to maintain a continuous network of conductors lacing the substrate.

Addition of conductive material to grooves and holes of the substrate to form the conductor matrix may be best accomplished by such methods as electroless plating or vapor deposition, although electroplating or brush plating processes may alternatively be employed. Each of these methods per se is well known in the art and falls within the generic classification of metalizing the substrate.

Metals which are suitable for use in the metallizing process to form the intraconnected conductor matrix include gold, silver, copper, nickel, rhodium, tin, palladium cobalt, and chromium. In some cases a conductive undercoat may be desirable before depositing the final conductive layer. However, the glass bonded mica substrate described above is readily coated by any of the above-mentioned metalization and will generally not require undercoating to provide adhesion or adherence of the metallic conductors to the substrate.

Figures 6, 7:
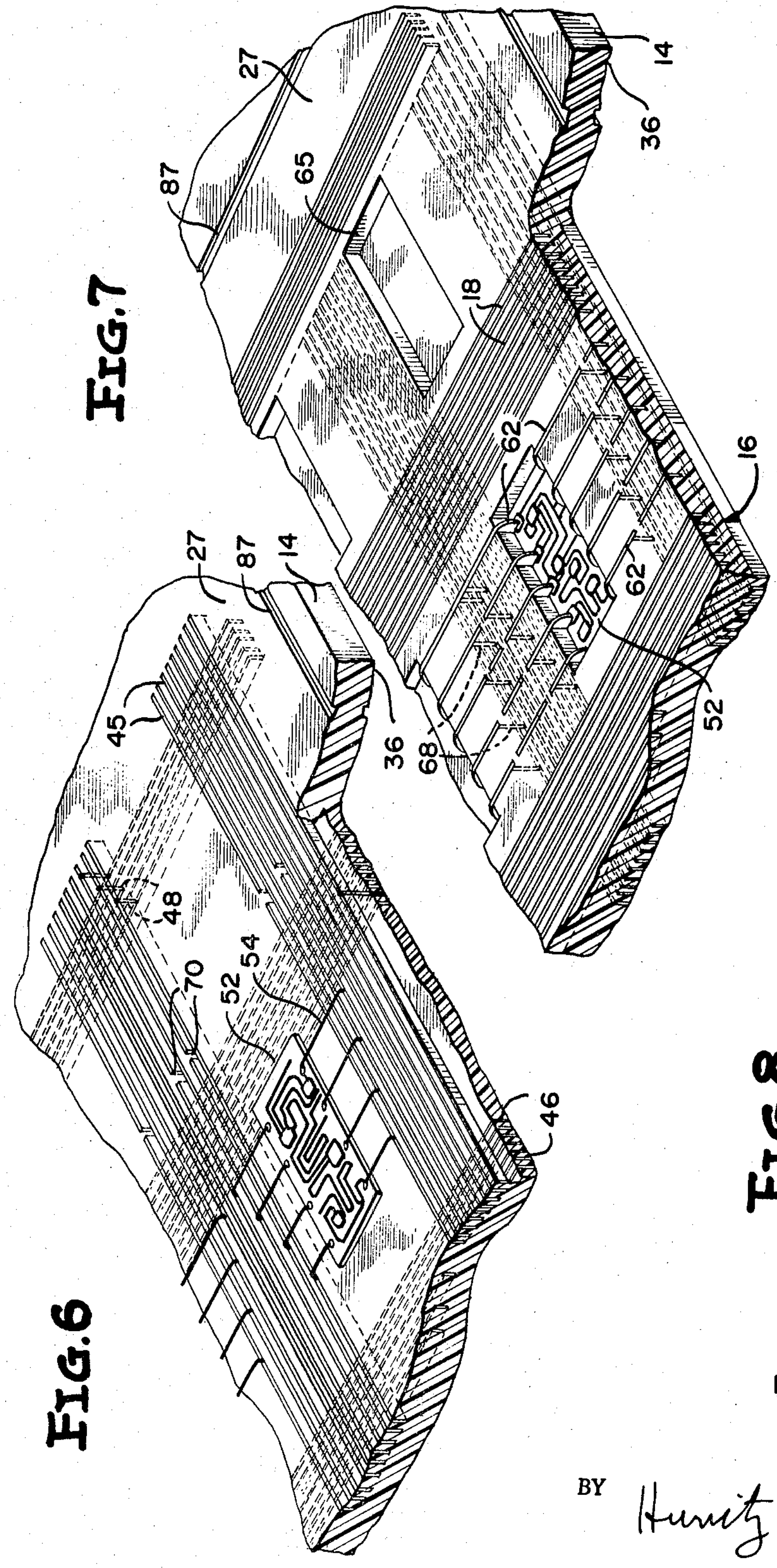
FIGURE 6 shows another form of chip installation and connection in fragmentary perspective view.
FIGURE 7 shows still another form of chip installation and connection in fragmentary perspective view.

When the metalizing process has been completed the support substrate is surface ground on both sides to remove all undesired conductive material from the surface area between the parallel conductors formed in the grooves so that no unwanted interconnections occur in the conductor matrix. The matrix, thus comprises a plurality of spaced lineal conductors 45, 46 in a number of groups of rows and columns conforming to the previous pattern of grooves and interconnected by through-conductors 48 at various crossover points (FIGURE 6). As previously mentioned, glass bonded mica substrates may be surface ground to optical flatness at minimum cost to provide smooth planar surfaces. After grinding and/or polishing, the substrate may be dipped and glazed to protect the surface conductors.

At this point, the substrate slice has been sufficiently prepared so that the microelectronic circuit chips may be positioned on and bonded to the substrate. The placement of the chips at surface areas of the slice will depend in large measure on the specific circuit design including the minimizing of conductor lengths for chips interconnections, and may be readily accomplished by automated techniques. After positioning of the chips 52 (FIGURES 5–7) on one or both surfaces of the substrate an integral bond is effected therebetween, preferably by thermo compression, to provide a multiplicity of circuit elements inseparably associated within a continuous substrate body and thus a completely integrated unit. The bonding temperatures employed will depend upon the particular characteristics of the substrate and the circuit chips. Most of the suitable grades of glass bonded mica substrates will withstand temperatures in excess of 700° F. applied on a continuous basis (see above table) and higher temperatures if applied for short periods of time. Since the bonding of the chips to the substrate may be accomplished in a relatively short length of time, temperatures in a range from 700° to 1000° F. have been found suitable for this purpose without harm to the substrate or to the component parts of the chips.

After the chips have been bonded to the surface of the substrate in integral relation therewith the interconnection of the chip circuits via the matrix of conductors may be accomplished. Suitable forms of connection for this purpose are shown in FIGURES 5, 6 and 7. In FIGURE 5, the microelectronic circuit chips 52 are positioned on and bonded to the substrate face-downwardly in "chip-flip" arrangement, requiring that appropriate holes be drilled prior thereto through the substrate corresponding in position to the positions of the chip lands, that is the conductive connection points on the face of the chips for the particular microelectronic circuit involved. In this case, since these holes have been previously metalized to form conductors 56 during the metalizing step of the process, the thermo compressional bonding of the chip to the substrate provides a positive electrical and mechanical connection between the conductor carrying holes and the chip lands, while simultaneously providing an integral connection between chip and substrate. The circuit arrangement of FIGURE 5 will also require additional parallel conductors 58 departing from the standard matrix. To this extent, this arrangement is less desirable than those to be described.

The connection between microelectronic circuit chips 52 and the conductors 45, 46 within the matrix may be more readily accomplished by use of conductive leads which are applied to the chips lands and to the matrix conductors by ball thermo compression or welding techniques. This arrangement is shown in FIGURE 6. The leads 54 connecting the microelectronic circuit to the conductors in the matrix have diameters on the order of 0.001 inch and hence special care is required to insure proper mechanical and electrical connection.

The most desirable method of connecting the chip circuits to the conductive matrix is shown in FIGURE 7. In this method, the connecting conductors 62 are provided between the circuit lands and the matrix conductors by vacuum deposition of conductive material with appropriate masking of other areas which are to remain untouched. Conductors 62 may be deposited along the substrate surface with the chips 52 bonded as shown in FIGURE 6, but preferably the chips are bonded within special recesses or cavities 65 forming chip berths, each cavity corresponding closely in dimensions to the dimensions of the chip itself. The depth of each cavity will be approximately equal to the depth of the matrix conductor grooves and the cavities themselves preferably provided during the molding operation. After the chip has been bonded to the substrate in its respective berth the leads or conductors 62 are deposited between the appropriate conductors in the matrix and the chip circuit lands. Extensions of conductors 62 across the surface of the substrate may lie in grooves provided by suitable masking and etching of the substrate, with subsequent deposition of conductive material. Through conductors 68 are provided during prior drilling and metalizing steps.

After bonding of the chips to the substrate and connection of the individual chip circuits to the conductor matrix have been completed, the subassembly which is provided up to this point is placed in a drill press or other appropriate apparatus for removal or severance of portions of the conductors to provide breaks in the matrix at predetermined points, e.g. 70 (FIGURE 6), for the purpose of providing the proper overall circuit terminations. Since the formation of the final circuit with its terminations is provided after the matrix has been applied to the substrate the value of the standardization of each module is readily descernible. Again, the removal of the conductor portions may be accomplished by the use of tape controlled machine tool operations as previously described. At this point the complete circuit contained within the module may be fully checked prior to completion of the overall assembly. Upon completion of the overall circuit testing the final module assembly is accomplished in the following manner.

A spacer plate 74 (FIGURES 2 and 3) of like material to that of substrate slice 14 and having a plurality of holes 77 corresponding in position to the position of microelectronic chips 52 on the substrate slice, is disposed over the substrate and chips, so that the chips (and associated leads if the arrangement of FIGURE 6 is utilized) lie within the boundaries of the mating holes. If the chips are bonded to both surfaces of the substrate a pair of spacer plates will be employed. Otherwise, that is if only one surface of the substrate includes circuit chips, only one spacer plate need be provided. The substrate slice 52 and spacer plate 74 are suitably interposed between a pair of cover plates 80, 82 which are preferably of thin anodized aluminum alloy and which are coated with a thin insulative layer such as a ceramic glaze on at least those surfaces which are to lie adjacent the substrate and spacer plate. Although other metallic plates may be employed it has been found that the anodized aluminum alloy offers high resistance to damaging effects of radiation exposure, and are advantageous where such exposure is contemplated.

To facilitate assembly of the four plates, that is cover plates 80, 82, the spacer plate 74 and substrate slice 14, each is preferably provided with either a tongue or a groove seal such as illustrated by reference numerals 86, 87 (FIGURE 2). Such an arrangement permits locking the plates in position to prevent false alignment of the several parts of the module. Those surfaces which are to be placed adjacent one another will have provided thereon, respectively, a tongue seal and a groove seal, with the tongue of one plate fitting into the groove of the adjacent plate in locked assembly.

When all four plates have been assembled into a single unit the outer edges of the plates are wetted, for example with indium solder, to hermetically seal the overall assembly. Indium is preferred as a solder seal because of its ability to wet ceramic, glass and oxides as well as metals. The hermetically sealed planar module is thus protected against dust, dirt, moisture, fungus and so forth as might detrimentally effect performance and reliability of the circuit. The tongue and seal locking arrangement between plates of the assembly also provides a barrier against the penetration of any sealant to the interior of the module which might cause shorting of the conductors and/or circuit connections.

As a final measure of protection a thin metal band or frame 89, preferably of aluminum, is wrapped about the ends of the assembly to prevent interior circuit damage due to external shock and vibration which may be transmitted by the module support panel. The frames or bands provide an elastic characteristic in the manner of spring washers, when several modules are stacked in a single container or panel, to absorb any impact loads or vibrations which may attend the operation of the device or craft within which the modules are located.

An exemplary final modular assembly is shown in FIGURE 1, and in exploded view in FIGURE 2 (without the sealing frame 89). Final modular packages have been constructed with dimensions on the order of 0.125 inch thick x 2.775 inch wide x 3.125 inch long, excluding external connector pin projections. In some instances the spacer plate or plates 74 may be unnecessary as where chip berths are provided and the step portion of the substrate is eliminated. In any case, the recessed chip configuration of FIGURE 7 permits the use of spacer plates without apertures.

While I have described certain specific embodiments and processes for practicing my invention, it will be understood that various changes and modifications in the specific details of construction and particular process steps may be resorted to without effecting a departure from the true spirit and scope of the present invention. For example, the above described assembly consists of a single substrate having matrix conductors oriented relatively transverse to those on opposite surfaces and microelectronic circuits chips bonded to one or both surfaces of the substrate in the gaps between the groups of conductors of the matrix as the primary component of the planar module. However, the invention is intended to include multilayer assemblies, that is a module containing several substrate layers with microelectronic circuit chips bonded on one or both sides of each surface layer, the substrates being separated by a spacer plate of molded construction as has been described, and to the various attendant modifications of such multilayer packages. Moreover, conductors on opposed surfaces may cross at other than an angle of 90°. It is therefore desired that the present invention be limited only by the scope of the appended claims.

I claim:

1. An integrated circuit package, comprising a plurality of microelectronic circuit components, an insulating substrate having a plurality of groups of parallel conductors extending longitudinally along one surface thereof and transversely along another surface thereof opposite said one surface, said groups of conductors on each surface spaced from each other by a distance sufficient to accommodate the bonding of said microelectronic circuit components to insulative portions of said surfaces, said microelectronic circuit components bonded to said substrate in the spaces between said groups of conductors, a predetermined pattern of conductors extending between said surfaces and interconnecting various longitudinal and transverse conductors at crossover points thereof to form an intraconnected conductor matrix, means electrically connecting said microelectronic circuit components to said matrix to form the desired integrated circuit, a pair of cover plates insulatively spaced from said opposite surfaces, means hermetically sealing said substrate, said components, said matrix, and said cover plates in a modular package, and means at least partially encompassing the edges of said package for absorbing impact loads and vibrations to which said package is subjected.

2. A universal modular package for integrated circuits, comprising a plurality of uncased microelectronic circuit chips, a supporting substrate slab having opposite surfaces and sides extending between said surfaces, an array of electrical connectors partially imbedded in said slab and projecting from one of said sides thereof, a plurality of parallel conductors imbedded in each of said surfaces and having exposed portions lying flush with the surface in which each is imbedded, said parallel conductors being in groups, each group separated from an adjacent group by a space sufficient to accommodate the positioning of a microelectronic circuit chip therebetween, said circuit chip bonded in integral relation with insulative regions of the substrate surfaces in said spaces separating said groups of conductors, the plurality of conductors on one of said surfaces extending transversely to the plurality of conductors on the other of said surfaces, conductive members interconnecting surface conductors to provide an intraconnected conductor matrix, said matrix electrically connected to said connectors, further conductive members electrically interconnecting said circuit chips via said matrix to form an integrated circuit having external connection points at said connectors, a pair of cover plates, a pair of insulative spacer members each interposed between one of said surfaces of said substrate and one of said cover plates in a tight fitting assembly, means forming a hermetic seal between the members of said assembly, and a metal band encompassing the edges of said assembly for absorbing vibrations transmitted thereto, said band having a gap therein to expose said array of electrical connectors.

3. The combination according to claim 1 further including recesses in the substrate at surface regions thereof between groups of adjacent surface conductors, said recesses forming berths for mounting the circuit chips integral with the substrate.

4. The combination according to claim 1 wherein said substrate comprises glass bonded mica having a coefficient of thermal expansion corresponding to at least the insulative material of which said microelectronic circuit chips are comprised.

5. An integrated circuit module comprising a plurality of microelectronic circuit chips, a supporting substrate slice, a matrix of conductors lacing surfaces of said substrate slice, said matrix including a plurality of rows of spaced conductors in separated parallel groups on one of a pair of opposite surfaces of said substrate slice and a plurality of columns of spaced conductors in separated parallel groups on the other of said pair of surfaces, conductive members extending through said substrate slice and interconnecting conductors on said opposite surfaces, said microelectronic circuit chips bonded in integral relation with said substrate slice at gaps between the separated groups of surface conductors and electrically connected via said matrix, said matrix having breaks in at least some of the conductors thereof to establish desired circuit terminations, a plurality of electrical terminals exposed at a side of said substrate slice between said surfaces and connected to surface conductors of said matrix to provide external circuit connection points for the integrated circuit, spacer substrate slices disposed adjacent and in contact with surfaces of said supporting substrate slice at which said microelectronic circuit chips are bonded, said spacer substrate slices having a plurality of apertures therein in a pattern conforming to the placement of said microelectronic circuit chips in said supporting substrate slice to prevent damage to portions of the chips or the electrical interconnections thereof projecting above the surfaces of the supporting substrate slice against which the spacer slices are disposed, a pair of metal cover plates between which said supporting and spacer slices are interposed, said cover plates having insulative coatings on surfaces adjacent the substrate slices, means providing a hermetic seal of the modular package comprising the cover plates and substrate slices, and band means encompassing the edges of said modular package and exposing said terminals for absorbing impact loads on said package.

References Cited

UNITED STATES PATENTS

| | | | |
|---|---|---|---|
| 2,427,144 | 9/1947 | Jansen | 317—101 |
| 2,914,706 | 11/1959 | Hill et al. | 317—101 |
| 3,011,379 | 12/1961 | Corwin | 317—101 |
| 3,264,597 | 8/1966 | Gammel. | |
| 3,292,241 | 12/1966 | Carroll. | |
| 3,293,353 | 12/1966 | Hendricks | 317—101 |
| 3,302,067 | 1/1967 | Jackson et al. | 317—101 |
| 3,312,771 | 4/1967 | Hessinger et al. | 317—101 |
| 3,316,458 | 4/1967 | Jenny | 317—101 |
| 2,986,675 | 5/1961 | Burson et al. | 317—101 |
| 3,077,511 | 2/1963 | Bohrer et al. | 174—68.5 |
| 3,128,332 | 4/1964 | Burkig et al. | 174—68.5 |
| 3,200,298 | 8/1965 | Garibotti | 317—101 |

ROBERT K. SCHAEFFER, *Primary Examiner.*

ROBERT S. MACON, *Examiner.*

W. C. GARVERT, DAVID SMITH, *Assistant Examiners.*